(12) United States Patent
Kamio et al.

(10) Patent No.: US 11,236,423 B2
(45) Date of Patent: Feb. 1, 2022

(54) FILM-FORMING APPARATUS

(71) Applicant: TOKYO ELECTRON LIMITED, Tokyo (JP)

(72) Inventors: Takashi Kamio, Nirasaki (JP); Tetsuya Saitou, Nirasaki (JP); Kai Shiono, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 16/726,369

(22) Filed: Dec. 24, 2019

(65) Prior Publication Data
US 2020/0208267 A1 Jul. 2, 2020

(30) Foreign Application Priority Data
Dec. 26, 2018 (JP) .............................. JP2018-243700

(51) Int. Cl.
*C23C 16/455* (2006.01)
*C23C 16/06* (2006.01)
(Continued)

(52) U.S. Cl.
CPC ........ *C23C 16/45565* (2013.01); *B05C 13/00* (2013.01); *C23C 16/06* (2013.01); *C23C 16/4586* (2013.01); *C23C 16/46* (2013.01)

(58) Field of Classification Search
CPC ................... C23C 16/45565; C23C 16/4586
See application file for complete search history.

(56) References Cited

U.S. PATENT DOCUMENTS 9,976,217 B2 * 5/2018 Gomi .................. C23C 16/52
2005/0183666 A1 * 8/2005 Tsuji .................... C23C 16/5096
118/723 E
(Continued)

FOREIGN PATENT DOCUMENTS

CN 101463473 A * 6/2009 ........... C23C 16/513
JP 2009239104 A 10/2009
(Continued)

OTHER PUBLICATIONS

Goto, Tetsuya, et al., "Establishment of very uniform gas flow pattern in the process chamber for microwave-excited high-density plasma by ceramic shower plate". J. Vac. Sci. Technol. A 27, 686-695, (2009). https://doi.org/10.1116/1.3143665.*
(Continued)

*Primary Examiner* — Bret P Chen
(74) *Attorney, Agent, or Firm* — Nath, Goldberg & Meyer; Jerald L. Meyer; Tanya E. Harkins

(57) ABSTRACT

A film-forming apparatus includes a processing container having a vacuum atmosphere therein, a stage having a heater and disposed in the processing container to load a substrate thereon, a gas discharge mechanism provided at a position to face the stage, and an exhaust part configured to exhaust an inside of the processing container. The gas discharge mechanism includes a gas intake port configured to introduce a processing gas into the processing container, a first plate-shaped member having a first opening formed in a more radially outward position than the gas intake port and a shower plate disposed between the first plate-shaped member and the stage to supply the processing gas from the first opening to a process space through a plurality of gas holes.

17 Claims, 8 Drawing Sheets

(51) Int. Cl.
*C23C 16/46* (2006.01)
*C23C 16/458* (2006.01)
*B05C 13/00* (2006.01)

(56) References Cited

U.S. PATENT DOCUMENTS

| | | | | |
|---|---|---|---|---|
| 2005/0258280 | A1* | 11/2005 | Goto | H01J 37/3244 239/548 |
| 2006/0100825 | A1* | 5/2006 | Furuya | H01L 21/67288 702/185 |
| 2006/0257243 | A1* | 11/2006 | Moriya | F04D 19/042 415/90 |
| 2008/0196666 | A1* | 8/2008 | Toshima | C23C 16/5096 118/723 E |
| 2009/0104351 | A1* | 4/2009 | Kakegawa | C23C 16/45572 427/248.1 |
| 2010/0104760 | A1* | 4/2010 | Matsui | B08B 7/04 427/294 |
| 2010/0192857 | A1* | 8/2010 | Kobayashi | C23C 16/4412 118/723 R |
| 2010/0230387 | A1* | 9/2010 | Okesaku | H01J 37/32449 216/69 |
| 2011/0226181 | A1* | 9/2011 | Yamamoto | H01L 21/76843 118/724 |
| 2013/0239993 | A1* | 9/2013 | Ogawa | C23C 16/4405 134/19 |
| 2014/0017900 | A1* | 1/2014 | Doha | H01L 21/68735 438/710 |
| 2014/0116338 | A1* | 5/2014 | He | C23C 14/083 118/723 E |
| 2014/0230730 | A1* | 8/2014 | Choi | C23C 16/45559 118/723 R |
| 2017/0018405 | A1* | 1/2017 | Kobayashi | H01L 21/31116 |
| 2021/0233749 | A1* | 7/2021 | Ishida | H01J 37/32642 |

FOREIGN PATENT DOCUMENTS

| | | | | |
|---|---|---|---|---|
| JP | | 5010234 B2 * | 6/2012 | H01L 21/31 |
| KR | 10-2009-0107081 A | | 10/2009 | |
| TW | | 201202470 A1 | 1/2012 | |
| WO | WO 2011/018912 A1 * | | 2/2011 | H01L 21/205 |

OTHER PUBLICATIONS

Choudhury, A.J., et al., "Synthesis and characterization of plasma polymerized styrene films by rf discharge". 23rd National Symposium on Plasma Science & Technology (PLASMA—2008); Journal of Physics: Conference Series 208 (2010) 012104, pp. 1-10.*

Okada, H., et al., "Formation of $SiO_2$ film by chemical vapor deposition enhanced by atomic species extracted from a surface-wave generated plasma". AIP Conference Proceedings 1807, 020006 (2017); https://doi.org/10.1063/1.4974788.*

Fredericks, S., et al., "Ring-shaped deposition patterns in small nozzle-to-plate distance impactors". Aerosol Science and Technology, 2018, vol. 52, No. 1, 30-37. Https://doi.org/10.1080/02786826.2017.1377829.*

Williams-Godwin, Lizandra, et al., "Open-source automated chemical vapor deposition system for the production of two-dimensional nanomaterials". PLoS ONE 14(1) Jan. 2019, pp. 1-2; e0210817. https://doi.org/10.1371/journal.pone.0210817.*

* cited by examiner

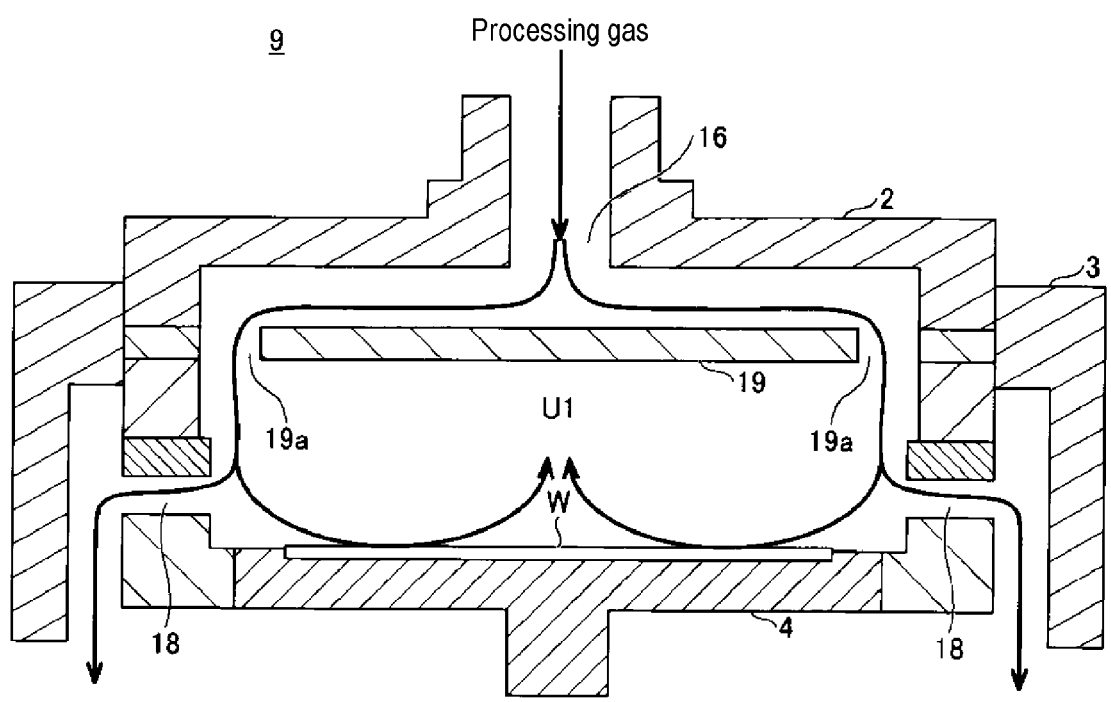

FILM-FORMING APPARATUS

CROSS-REFERENCE TO RELATED APPLICATION

This application is based upon and claims the benefit of priority from Japanese Patent Application No. 2018-243700, filed on Dec. 26, 2018, the entire contents of which are incorporated herein by reference.

TECHNICAL FIELD

The present disclosure relates to a film-forming apparatus and method.

BACKGROUND

In the related art, a film-forming apparatus supplies a gas including a source gas from a shower head having a gas hole formed uniformly to a surface facing a substrate to form a film on the substrate. In such a film-forming apparatus, the gas pressure is high in the center portion of the shower head and the flow speed of a gas toward the outer periphery is low in the vicinity of the center portion of the substrate. Thus, the concentration of the source gas increases in the vicinity of the center portion of the substrate so that the film thickness increases at the center of the substrate, thereby resulting in a case where it is difficult to achieve in-plane uniformity.

Accordingly, patent document 1 proposes a film-forming apparatus that sprays a gas outside the outer periphery of a substrate and exhausts the gas from an exhaust hole disposed radially outside the outer periphery of the substrate. According to this apparatus, by forming a film on a substrate by the chemical species diffused to the surface of the substrate from the outside of the substrate, it is possible to improve in-plane uniformity of the film.

PRIOR ART DOCUMENT

[Patent Document] Japanese Patent Application Publication No. 2009-239104

SUMMARY

According to embodiments of the present disclosure, there is provided a film-forming apparatus includes a processing container having a vacuum atmosphere therein, a stage having a heater and disposed in the processing container to load a substrate thereon, a gas discharge mechanism provided at a position to face the stage, and an exhaust part configured to exhaust an inside of the processing container. The gas discharge mechanism includes a gas intake port configured to introduce a processing gas into the processing container, a first plate-shaped member having a first opening formed in a more radially outward position than the gas intake port and a shower plate disposed between the first plate-shaped member and the stage to supply the processing gas from the first opening to a process space through a plurality of gas holes.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 4A and 4B are views showing an example of the flow of a processing gas in a film-forming apparatus according to an embodiment and a film-forming apparatus of a comparative example.

DETAILED DESCRIPTION

Figure 1:
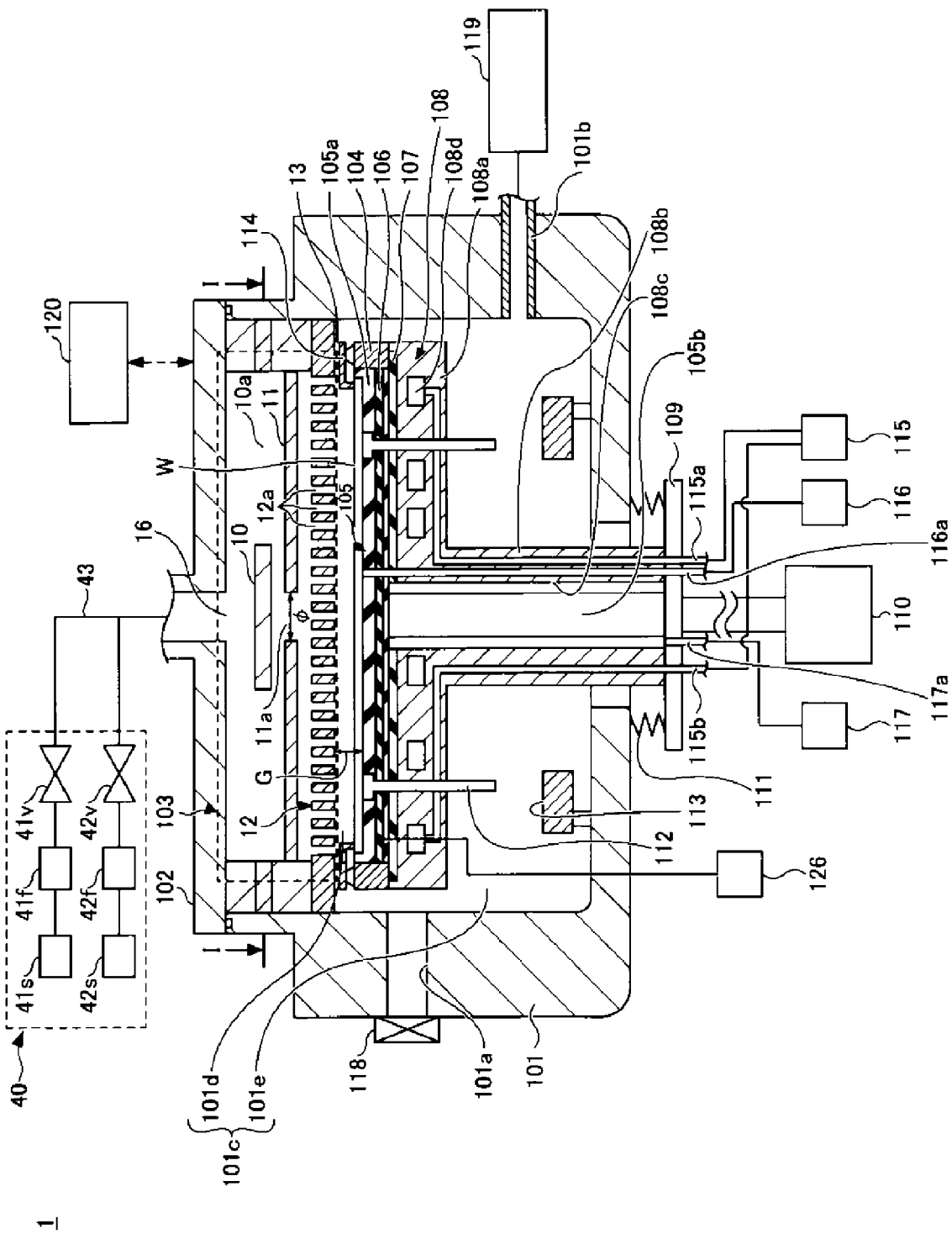
FIG. 1 is a schematic cross-sectional view of a film-forming apparatus at a processing position according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure are described with reference to drawings. Further, in the specification and drawings, components that are substantially the same are given the same reference numerals and repeated description is omitted.

[Film-Forming Apparatus]

Figure 2:
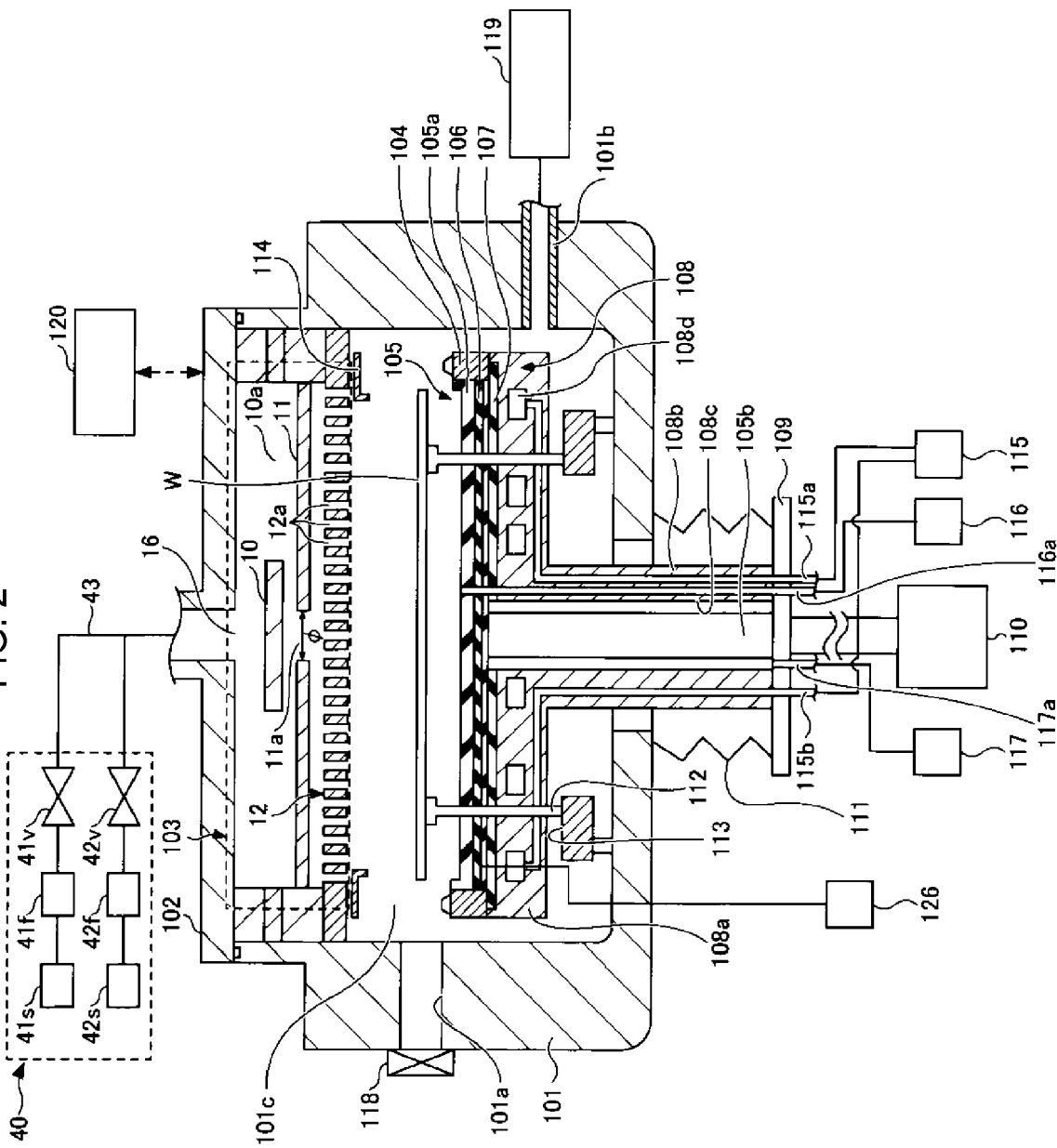
FIG. 2 is a schematic cross-sectional view of a film-forming apparatus at a transfer position according to an embodiment.

First, an example of the configuration of a film-forming apparatus 1 according to an embodiment of the present disclosure is described with reference to FIG. 1. FIG. 1 is a schematic cross-sectional view of a film-forming apparatus 1 at a processing position according to an embodiment. FIG. 2 is a schematic cross-sectional view of the film-forming apparatus 1 at a transfer position according to an embodiment. The film-forming apparatus 1 shown in FIGS. 1 and 2 is a Chemical Vapor Deposition (CVD) apparatus, for example, an apparatus that performs a ruthenium-embedding process for embedding ruthenium. For example, a ruthenium film is formed on a wafer W by supplying a processing gas including ruthenium-containing gas (a source gas or precursor) such as Triruthenium dodecacarbonyl $Ru_3(CO)_{12}$ and a carrier gas such as CO.

The film-forming apparatus 1 includes a processing container 101. The processing container 101 is a container having an opening at the top and having a bottom. The inside of the processing container 101 becomes a vacuum atmosphere when a film is formed. The processing container 101 includes therein a stage 105 for loading a wafer W and a gas discharge mechanism 103 disposed at an upper portion in the processing container 101 to face the stage 105 to supply a gas to the surface of the wafer W. The gas discharge mechanism 103 defines a space for introducing the gas. The configuration of the gas discharge mechanism 103 is described below.

A support member 102 supports the gas discharge mechanism 103. Further, the support member 102 closes the top opening of the processing container 101, so the processing container 101 is sealed, thereby forming a processing chamber 101c. A gas supplier 40 supplies a source gas such as a ruthenium-containing gas and a carrier gas such as CO gas to the gas discharge mechanism 103 through a gas intake port 16 formed by a supply pipe passing through the support member 102. The ruthenium-containing gas or the carrier gas supplied from the gas supplier 40 is supplied into the processing chamber 101c from the gas discharge mechanism 103. Further, the ruthenium-containing gas or the carrier gas is an example of a processing gas.

The stage 105 has a plate part 105a, which is, for example, made of an aluminum nitride or quartz in a flat disk shape. A heater 106, which is an example of a heating part for heating the wafer W, is embedded in the stage 105. The heater 106 is, for example, a sheet type resistance heater. The heater 106 generates heat using power from a power source 126 disposed outside the processing container 101, and heats the wafer W up to a predetermined process temperature suitable for film-forming by heating a loading surface of the stage 105. The heater 106 heats the wafer W loaded on the stage 105, for example, up to 130 to 300 degrees C.

Further, the stage 105 includes a support member 105b extending downward from the center of the bottom of the stage 105 through the bottom of the processing container 101. An end of the support member 105b is supported on an elevator 110 through an elevation plate 109. The support member 105b, the elevation plate 109, and the elevator 110 are an example of a moving mechanism, which can move up and down, of the stage 105.

Further, a temperature adjustment jacket 108 is disposed under the stage 105 as a temperature adjustment member. The temperature adjustment jacket 108 has a plate portion 108a formed at the upper portion that has a size substantially the same as the stage 105, and a shaft portion 108b that is formed at the lower portion and larger in diameter than the support member 105b. Further, the temperature adjustment jacket 108 has a hole portion 108c formed in the up-down direction at the center through the plate portion 108a and the shaft portion 108b.

The temperature adjustment jacket 108 accommodates the support member 105b in the hole portion 108c and is disposed to cover the entire rear surface of the stage 105 with the hole portion 108c covering the support member 105b.

The temperature adjustment jacket 108 has a coolant flow path 108d in the plate portion 108a and two coolant pipes 115a and 115b in the shaft portion 108b. The coolant flow path 108d has an end connected to the coolant pipe 115a and another end connected to another coolant pipe 115b. The coolant pipes 115a and 115b are connected to a coolant unit 115.

The coolant unit 115 is, for example, a chiller unit. The coolant unit 115 can control the temperature of a coolant and supplies the coolant at a predetermined temperature to the coolant pipe 115a. The coolant is supplied to the coolant flow path 108d through the coolant pipe 115a from the coolant unit 115. The coolant supplied to the coolant flow path 108d returns to the coolant unit 115 through the coolant pipe 115b. The temperature adjustment jacket 108 can adjust temperature by circulating a coolant, for example, cooling water, through the coolant flow path 108d.

An insulating ring 107 is disposed as an insulating member between the stage 105 and the temperature adjustment jacket 108. The insulating ring 107 is, for example, made of SUS316, A5052, Ti (titanium), ceramic, or the like in a disk shape.

The insulating ring 107 has a gap in a space with the stage 105. The gap is formed in all circumferential direction so that the hole portion 108c communicates with the outer periphery of the temperature adjustment jacket 108. For example, the insulating ring 107 has a plurality of protrusions on the top surface facing the stage 105.

In the insulating ring 107, a plurality of protrusions is formed, for example, in a form of a plurality of two rows which are formed concentrically in a circumferential direction with a separation therebetween. Further, the protrusions may be one or more rows that are concentrically formed.

The shaft portion 108b of the temperature adjustment jacket 108 passes through the bottom of the processing container 101. The lower end of the temperature adjustment jacket 108 is supported on the elevator 110 through the elevation plate 109 disposed under the processing container 101. A bellows 111 is disposed between the bottom of the processing container 101 and the elevation plate 109, and airtight seal of the inside of the processing container 101 is maintained even against up-down movement of the elevation plate 109.

As the elevator 110 moves up/down the elevation plate 109, it is possible to control a distance G between the shower plate 12 and the stage 105. Further, the stage 105 can be moved up/down between a processing portion (see FIG. 1) where the wafer W is processed and a transfer position (see FIG. 2) where the wafer W is transferred through a loading/unloading gate 101a from an external transfer mechanism (not shown).

Elevation pins 112 support the bottom surface of the wafer W and lift the wafer W from the loading surface of the stage 105 when the wafer W is transferred from the external transfer mechanism (not shown). The elevation pins 112 have a shaft portion and a head portion having a larger diameter than the shaft portion. Through-holes through which the shaft portion of the elevation pins 112 passes are formed through the stage 105 and the plate portion 108a of the temperature adjustment jacket 108. Further, grooves for accommodating the head portions of the elevation pins 112 are formed on the loading surface of the stage 105. Contact members 113 are disposed under the elevation pins 112.

When the stage 105 is moved to the processing position (see FIG. 1) for the wafer W, the head portions of the elevation pins 112 are accommodated in the grooves and the wafer W is loaded on the loading surface of the stage 105. Further, the head portions of the elevation pins 112 are locked in the grooves, the shaft portions of the elevation pins 112 pass through the stage 105 and the plate portion 108a of the temperature adjustment jacket 108, and the lower ends of the shaft portions of the elevation pins 112 protrude from the plate portion 108a of the temperature adjustment jacket 108. Meanwhile, when the stage 105 is moved to the transfer position for the wafer W (see FIG. 2), the lower ends of the elevation pins 112 come in contact with the contact members 113 and the head portions of the elevation pins 112 protrude from the loading surface of the stage 105. Accordingly, the head portions of the elevation pins 112 support the bottom surface of the wafer W and lifts the wafer W from the loading surface of the stage 105.

An annular member 114 is disposed above the stage 105. In a state where the stage 105 is moved to the processing position (see FIG. 1) for the wafer W, the annular member 114 comes in contact with the outer periphery of the top of the wafer W and the wafer W is pressed to the loading surface of the stage 105 by the weight of the annular member 114. Meanwhile, in a state where the stage 105 is moved to the transfer position (see FIG. 2) for the wafer W, the annular member 114 is locked to a locking portion (not shown) above the loading/unloading gate 101a, so that it does not hinder the wafer W from being transferred by a transfer mechanism (not shown).

A heat transmission gas supplier 116 supplies a heat transmission gas such as a He gas or the like between the rear surface of the wafer W loaded on the stage 105 and the loading surface of the stage 105 through a pipe 116a, a flow path (not shown) formed in the temperature adjustment jacket 108, and a flow path (not shown) formed in the stage 105.

A purge gas supplier 117 supplies a purge gas such as a CO gas between the bottom surface of the annular member 114 and the top surface of the stage 105 through a pipe 117a, a gap formed between the support member 105b of the stage 105 and the hole portion 108c of the temperature adjustment jacket 108, a flow path (not shown) formed between the stage 105 and the insulating ring 107, and a second flow path (not shown) formed at the outer periphery portion of the stage 105 in the up-down direction. Accordingly, inflow of a process gas into the space between the bottom surface of the annular member 114 and the top of the stage 105 is suppressed, thereby preventing a film from being formed on the bottom surface of the annular member 114 or on the top surface of the outer periphery portion of the stage 105.

An exhaust hole 13 that exhausts the process space 101d over the stage 105 is formed radially outside the stage 105. A cover ring 104 is engaged with the outer periphery of the stage 105, the annular member 114 positioned on the cover ring 104 presses the peripheral edge of the wafer W. A processing gas is radially outwardly exhausted by the exhaust hole 13 formed between the top surface of the annular member 114 pressing the peripheral edge of the wafer W and the bottom surface of the shower plate 12. The exhaust hole 13 is an opening formed between the top surface of the annular member 114 and the bottom surface of a protrusion formed at the outer periphery of the shower plate 12, and communicates with the space of the processing container 101.

The loading/unloading gate 101a for loading and unloading the wafer W and a gate valve 118 that opens/closes the loading/unloading gate 101a are provided in a side wall of the processing container 101.

An exhaust part 119 including a vacuum pump or the like is connected to the lower portion of a side wall of the processing container 101 through an exhaust pipe 101b. The inside of the processing container 101 is exhausted by the exhaust part 119, and the inside of the processing chamber 101c is set and maintained in a predetermined vacuum atmosphere (e.g., 1.33 Pa). The exhaust pipe 101b and the exhaust part 119 are an example of an exhaust mechanism that exhausts the inside of the processing container 101. The exhaust mechanism is positioned lower than the stage 105.

A gas intake port 16 is formed through a center of the ceiling of the gas discharge mechanism 103. The gas intake port 16 is connected to the gas supplier 40 through a gas line 43 and introduces a processing gas including a source gas and a carrier gas to the gas discharge mechanism 103.

The gas supplier 40 includes flow rate controllers 41f and 42f and valves 41v and 42v. Each of the flow rate controllers 41f and 42f is a mass flow controller or a pressure control type flow rate controller.

A gas source 41s is connected to an inlet of the flow rate controller 41f. The gas source 41s is, for example, the source of $Ru_3(CO)_{12}$ that can be used as a source gas. The outlet of the flow rate controller 41f is connected to the gas line 43 through the valve 41v.

A gas source 42s is connected to an inlet of the flow rate controller 42f. The gas source 42s is, for example, the source of CO gas that can be used as a carrier gas. The outlet of the flow rate controller 42f is connected to the gas line 43 through the valve 42v.

Further, the film-forming apparatus 1 may supply a rare gas from a gas source (not shown). The gas supplier 40 controls the flow rate of a processing gas from the gas sources 41s and 42s and supplies the flow rate-controlled processing gas into the processing container 101 from the gas intake port 16.

The film-forming apparatus 1 may further include a controller 120. The controller 120 may be a computer, which includes a processor, a storage such as a memory, an input device, a display device, an I/O interface for signals, etc. The controller 120 controls each of the components of the film-forming apparatus 1. For example, the controller 120 controls the operation of the film-forming apparatus 1 by controlling the gas supplier 40, the heater 106, the elevator 110, the coolant unit 115, the heat transmission gas supplier 116, the purge gas supplier 117, the gate valve 118, the exhaust part 119, etc.

The controller 120 allows an operator to perform an input operation of commands using an input device to manage the film-forming apparatus 1. Further, the controller 120 may visually show the operation state of the film-forming apparatus 1 using the display device. Further, control programs and recipe data are stored in the storage. The control programs are executed by the processor to perform various processes in the film-forming apparatus 1. The processor executes the control programs and controls each component of the film-forming apparatus 1 according to the recipe data.

Next, an example of the operation of the film-forming apparatus 1 is described. Further, in the beginning, the inside of the processing chamber 101c is in a vacuum atmosphere by the exhaust part 119. Further, the stage 105 is in the transfer position.

The controller 120 opens the gate valve 118. Here, the wafer W is loaded onto the elevation pins 112 by the external transfer mechanism (not shown). When the transfer mechanism (not shown) moves outside the loading/unloading gate 101a, the controller 120 closes the gate valve 118.

The controller 120 moves the stage 105 to the processing position by controlling the elevator 110. At this time, the stage 105 is moved up, so that the wafer W loaded on the elevation pins 112 is loaded onto the loading surface of the stage 105. Further, the annular member 114 comes in contact with the outer periphery of the top surface of the wafer W, and the wafer W is pressed against the loading surface of the stage 105 by the weight of the annular member 114. Accordingly, the process space 101d and a lower space 101e are formed over the stage 105 and under the stage 105, respectively, in the processing chamber 101c.

At the processing position, the controller 120 operates the heater 106 and controls the gas supplier 40 to supply the source gas of $Ru_3(CO)_{12}$ and a carrier gas of CO into the process space 101d of the processing chamber 101c from the gas discharge mechanism 103. Accordingly, a ruthenium film is formed on the wafer W. The gas after the process passes through the exhaust hole 13 above the top surface of the annular member 114 from the process space 101d, flows down to the lower space 101e, and is then exhausted by the exhaust part 119 through the exhaust pipe 101b.

At this time, the controller 120 controls the heat transmission gas supplier 116 to supply a heat transmission gas between the rear surface of the wafer W loaded on the stage 105 and the loading surface of the stage 105. Further, the controller 120 controls the purge gas supplier 117 to supply a purge gas to the bottom surface of the annular member 114 and the top surface of the stage 105. The purge gas passes through the flow path in the bottom surface side of the annular member 114, flows to the lower space 101e, and is then exhausted through the exhaust pipe 101b by the exhaust part 119.

When the predetermined process is completed, the controller 120 controls the elevator 110 to move the stage 105 to the transfer position. At this time, the stage 105 is moved down, so that the annular member 114 is locked to a locking portion (not shown). Further, the lower ends of the elevation pins 112 come into contact with the contact members 113 and the head portions of the elevation pins 112 protrude from the loading surface of the stage 105, thereby lifting the wafer W from the loading surface of the stage 105.

The controller 120 opens the gate valve 118. Here, the wafer W loaded on the elevation pins 112 is taken out by the external transfer mechanism (not shown). When the transfer mechanism (not shown) moves outside the loading/unloading gate 101a, the controller 120 closes the gate valve 118.

As described above, according to the film-forming apparatus 1 shown in FIGS. 1 and 2, it is possible to perform a predetermined processing such as film forming on the wafer W.

[Configuration of Gas Discharge Mechanism]

Next, a configuration of the gas discharge mechanism 103 is described. A first plate-shaped member 10, a second plate-shaped member 11, and a shower plate 12 are sequentially disposed in order from top between the gas intake port 16 in the gas discharge mechanism 103 and the stage 105. The first plate-shaped member 10, the second plate-shaped member 11, and the shower plate 12 are all disk-shaped members and are disposed to face the stage 105 by extending horizontally in parallel while being spaced from one another in the gas discharge mechanism 103.

Figure 3:
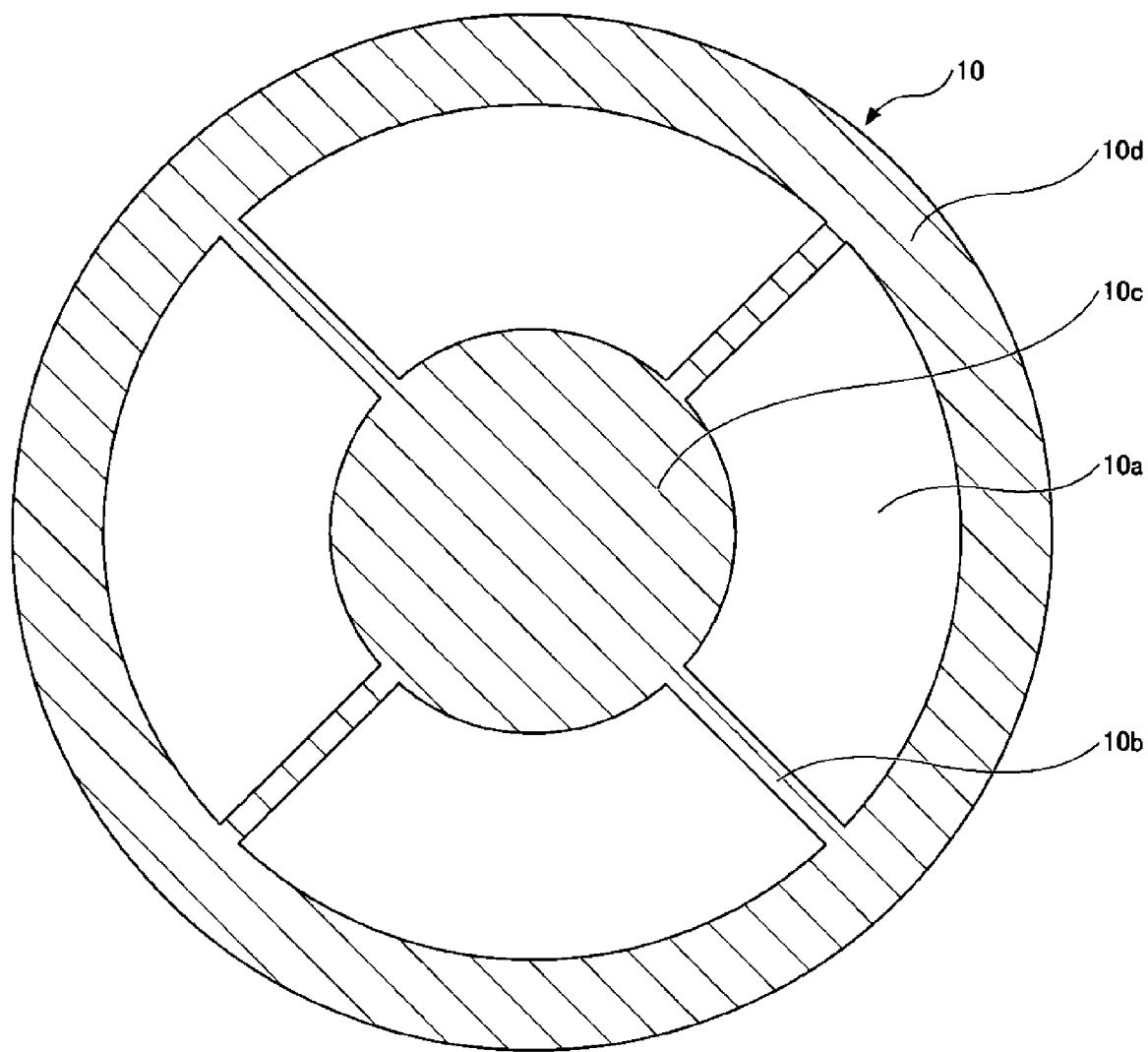
FIG. 3 is a cross-sectional view taken along line I-I of FIG. 1.

The first plate-shaped member 10 is disposed to face the gas intake port 16. The first plate-shaped member 10 has first openings 10a formed in a more radially outward position than the gas intake port 16. FIG. 3 is a cross-sectional view taken along line I-I of FIG. 1. The first plate-shaped member 10 has four first openings 10a formed in a circumferential direction between a circular plate member 10c at the center and a disk member 10d at the outer side. The circular plate member 10c at the center and the disk member 10d at the outer side are connected through supporting portions 10b. However, the number of the first openings 10a and the number of the supporting portions 10b are not limited thereto and two or more may be possible.

Further, it is preferable that the circular plate member 10c at the center is larger than the diameter of the gas intake port 16, and is, for example, 8 to 34 cm. By making the size of the circular plate member 10c at the center larger than the diameter of the gas intake port 16, the ratio of a gas, which contacts the central circular plate member 10c from the upstream side, increases and gas can be efficiently diffused.

Further, it is possible to efficiently suppress particles, which may be included at the upstream side, at the central circular plate member 10c.

Referring back to FIG. 1, the second plate-shaped member 11 is disposed between the first plate-shaped member 10 and the shower plate 12, and has a second opening 11a at the center portion. The first openings 10a and the second opening 11a do not overlap in a plan view.

The shower plate 12 is disposed between the first plate-shaped member 10 and the stage 105, and supplies a processing gas into the process space for the wafer W from a plurality of gas holes 12a. The outermost gas hole 12a of the plurality of gas holes 12a of the shower plate 12 is positioned in a more radially outward position than the wafer W on the stage 105. Since the outermost gas hole 12a is positioned in a more radially outward position than the wafer W on the stage 105, it is possible to efficiently and/or uniformly diffuse and supply a processing gas. The shower plate 12 partitions the inside of the gas discharge mechanism 103 into the processing chamber 101c having a process space 101d close to the stage 105 and a space close to the gas intake port 16 (gas intake space).

[Flow of Processing Gas]

Figure 4A:
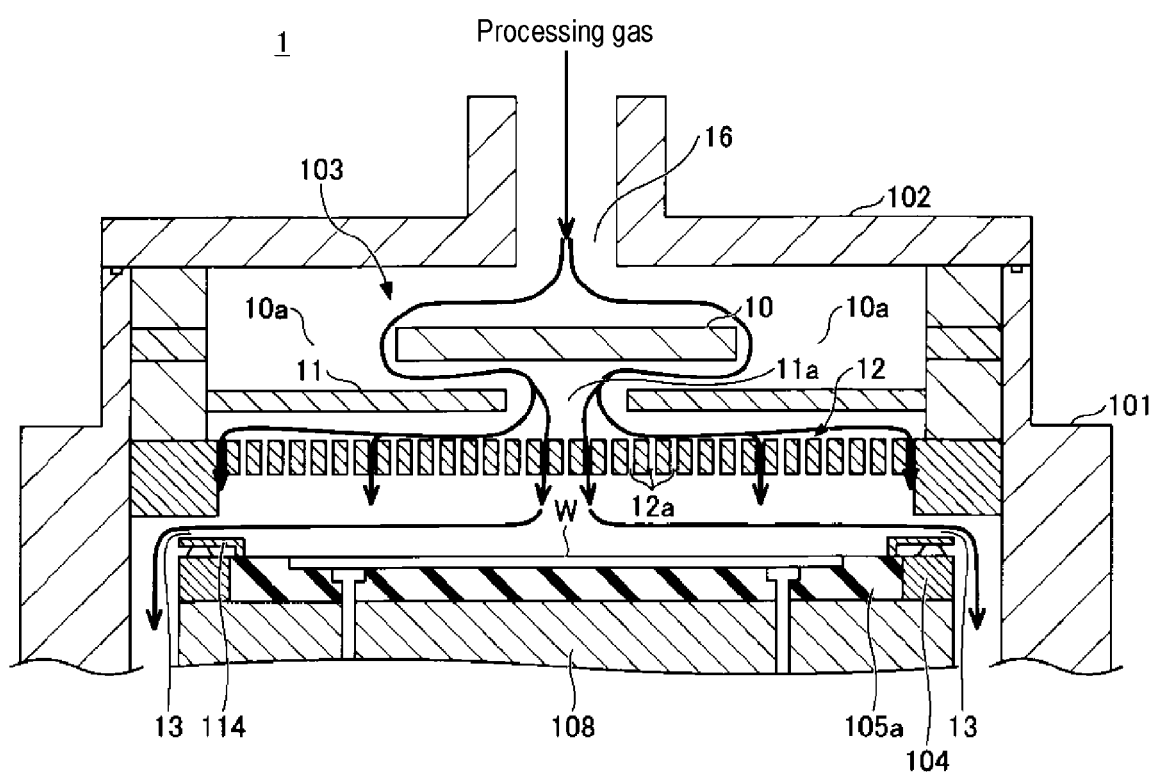

Next, the flow of the processing gas is described by comparing a film-forming apparatus of a comparative example with the film-forming apparatus 1 according to an embodiment with reference to FIGS. 4A and 4B. FIG. 4A is a view schematically showing the flow of a processing gas in the film-forming apparatus 1 according to an embodiment. FIG. 4B is a view schematically showing the flow of a processing gas in a film-forming apparatus 9 according to a comparative example.

The film-forming apparatus 9 according to the comparative example includes a baffle plate 19 facing the gas intake port 16. The baffle plate 19 has an opening 19a in a more radially outward position than the gas intake port 16. The film-forming apparatus 9 does not include the second plate-shaped member 11 and the shower plate 12.

In the film-forming apparatus 9, a processing gas introduced from the gas intake port 16 flows radially outward while passing a space between the baffle plate 19 and the ceiling of a processing container 2 to pass through the opening 19a. Further, a processing gas is injected to a position that is more radially outward than a wafer W. Further, in the film-forming apparatus 9, the processing gas is exhausted from an exhaust hole 18 disposed more radially outward than the outer periphery of the wafer W. Accordingly, the processing gas being exhausted through the opening 19a and the exhaust hole 18 is diffused in a process space U1 at the same time, so that a film is formed on the wafer by the chemical species of a source gas diffusing to the surface of the wafer W from the outside of the wafer W, whereby in-plane uniformity of the film can be improved.

As compared with the film-forming apparatus 9 of the comparative example, the film-forming apparatus 1 according to an embodiment shown in FIG. 4A has a structure in which in-plane uniformity can be further improved and particles can be reduced. The processing gas introduced from the gas intake port 16 contains a large number of particles. The processing gas first contacts the first plate-shaped member 10. As a result, some of the particles in the processing gas remain on the top surface of the first plate-shaped member 10. Accordingly, it is possible to reduce the particles in the processing gas.

The processing gas flows radially outward on the first plate-shaped member 10. Thereafter, the processing gas passes through the first openings 10a of the first plate-shaped member 10 and then flows radially inward between the first plate-shaped member 10 and the second plate-shaped member 11.

Further, the processing gas flows downward from the second opening 11a formed at the center of the second plate-shaped member 11. The shower plate 12 is disposed under the second plate-shaped member 11. The processing gas flows outward between the second plate-shaped member 11 and the shower plate 12 to flow to any gas holes 12a of the shower plate 12. Accordingly, the processing gas is supplied in a shower form to a space above the wafer W. The processing gas supplied in a shower form is used for forming a film on the wafer W and is then exhausted outside from the exhaust hole 13 provided in a position, which is more radially outward than the stage 105, through the lower space 101e under the stage 105.

As described above, particles in the processing gas are reduced by the first plate-shaped member 10. Further, the processing gas is collected to the center by the second opening 11a formed at the center of the second plate-shaped member 11, and is then sent to the shower plate 12. Accordingly, it is possible to uniformly diffuse the processing gas in the space close to the stage 105 from several gas holes 12a. Therefore, it is possible to further improve in-plane uniformity of a film, as compared with the film-forming apparatus 9 of the comparative example.

[Experimental Results]

Figure 5:
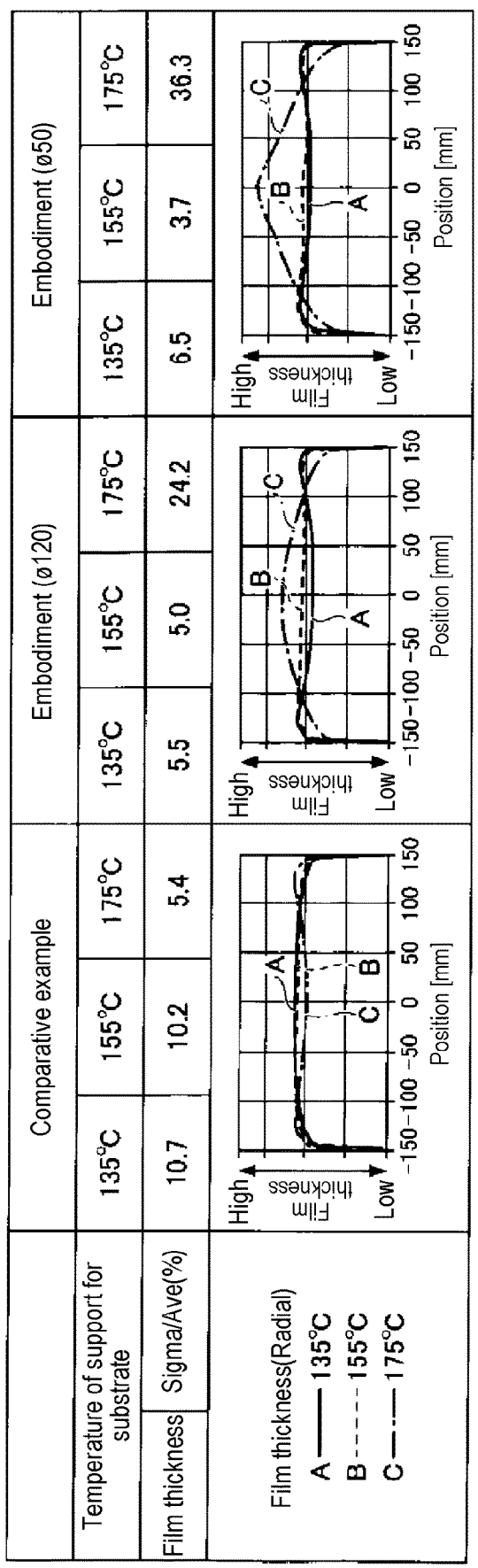
FIG. 5 is an example of a film-forming experimental result by a film-forming apparatus according to an embodiment and a film-forming apparatus of a comparative example.

Next, an example of an experimental result of film-forming processing using the film-forming apparatus 1 according to an embodiment and the film-forming apparatus 9 of a comparative example is described with reference to FIG. 5. The "comparative example" of FIG. 5 shows an example of an experimental result of a film-forming processing using the film-forming apparatus 9 shown in FIG. 4B. The "embodiment" of FIG. 5 shows an example of an experimental result of a film-forming processing using the film-forming apparatus 1 shown in FIG. 4A.

φ120 of the embodiment is an example where a diameter φ of the second opening 11a of the second plate-shaped member 11 shown in FIG. 1 is 120 mm and φ50 of the embodiment is an example where the diameter φ of the second opening 11a is 50 mm.

Further, FIG. 5 is an experimental result where a gas mixture of a source gas of $Ru_3(CO)_{12}$ gas and a carrier gas CO gas as a processing gas is introduced at 100 sccm from the gas intake port 16 and a ruthenium film is formed on a wafer W. In the experiment, the temperature of the stage 105 was set at 135 degrees C., 155 degrees C., and 175 degrees C. using the heater 106 in the stage 105.

In the experimental result of FIG. 5, the film thickness of the ruthenium film formed on the wafer W was about 10 nm. Sigma/Ave (%) of the film thickness shows a degree (%) of variation to a film thickness average value of the film thickness at 49 plots which are substantially uniformly scattered on the wafer W.

The (radial) film thickness is a film thickness measured in a radial direction passing through the center of the wafer W (diameter of 300 mm). In the (radial) film thickness graph, A shows the radial film thickness of the wafer W when the stage 105 was set at 135 degrees C. B shows the radial film thickness of the wafer W when the stage 105 was set at 155 degrees C. C shows the radial film thickness of the wafer W when the stage 105 was set at 175 degrees C.

According to the experimental result, in the comparative example, when the temperature of the stage 105 was 135 degrees C. and 155 degrees C., the Sigma/Ave (hereafter, referred to as "degree of film thickness variation") was 10.7(%) and 10.2(%).

On the other hand, in the embodiment, in case where the diameter φ of the second opening 11a was 120 mm, the degree of film thickness variation was 5.5(%) and 5.0(%) when the temperature of the stage 105 was 135 degrees C. and 155 degrees C. Further, in case where the diameter φ of the second opening 11a was 50 mm, the degree of film thickness variation was 6.5(%) and 3.7(%) when the temperature of the stage 105 was 135 degrees C. and 155 degrees C.

According to the experimental result, in the embodiment, under relatively low temperatures of 135 degrees C. and 155 degrees C., when the diameter φ of the second opening 11a was 120 mm and 50 mm, the film thickness variation was about half or less in comparison to the comparative example, so the in-plane uniformity of the film was improved.

When the same amount of the same processing gas was introduced at the same flow rate, the flow speed of the processing gas above the shower plate 12 in the film-forming apparatus 1 according to the embodiment was higher than the film-forming apparatus 9 of the comparative example. Due to this influence, when the temperature of the stage 105 is a low temperature of 135 degrees C., the higher the flow speed of the processing gas, the lower the film-forming rate.

Meanwhile, when the temperature of the stage 105 is reached high temperatures of 155 degrees C. and 175 degrees C., it can be seen that the higher the flow speed of the processing gas, the higher the film-forming rate due to the influence of temperature. One of the reasons for this may be that it was possible to uniformly supply the processing gas onto the wafer W by providing the shower plate 12 and thus, when the temperature of the stage 105 is over 155 degrees C. or higher, it was possible to increase efficiency of the processing gas used in the film-formation.

Further, by providing the shower plate 12, the inside of the processing chamber 101c is divided into the space close to the gas intake port 16 and the process space 101d. Accordingly, a pressure difference is generated between the gas intake port 16 and the processing chamber 101c. Accordingly, it is possible to uniformly supply a processing gas to the wafer W.

As shown in the graph of the film thickness of FIG. 5, according to A and B showing the radial film thicknesses when the stage 105 was set at 135 degrees C. and 155 degrees C., respectively, it can be seen that the in-plane uniformity was enhanced when the diameter φ of the second opening 11a was 120 mm and 50 mm in the film-forming apparatus 1.

Further, it can be seen from the graph of the film thickness that the optimal size of the diameter φ of the second opening 11a is changed by the temperature of the stage 105. For example, when the temperature of the stage 105 is 135 degrees C. or 155 degrees C., a change of the flow of the processing gas by the size of the diameter φ of the second opening 11a has little influence on the in-plane uniformity of the film. However, when the temperature of the stage 105 is 175 degrees C., a change of the flow of the processing gas by the size of the diameter φ of the second opening 11a results in a substantial influence on the in-plane uniformity of the film. In detail, when the diameter φ is 50 mm, the film-forming rate is higher at the center than the outer periphery of the wafer W and the film thickness is also larger at the center portion than the outer periphery of the wafer W, as compared with the case when the diameter φ is 120 mm. Accordingly, it is preferable that the diameter of the second opening 11a is 5 to 31 cm.

Accordingly, it can be seen that it is possible to change the film thickness distribution using the diameter of the second opening 11a. From the forgoing, it can be seen that it is preferable to provide the first plate-shaped member 10 and the shower plate 12 together because the second plate-shaped member 11 collects the processing gas to the center immediately before the processing gas is supplied to the shower plate 12, for becoming one of parameters for the in-plane uniformity. However, when the first plate-shaped member 10 and the shower plate 12 are installed, it is not required to install the second plate-shaped member 11.

Figure 6:
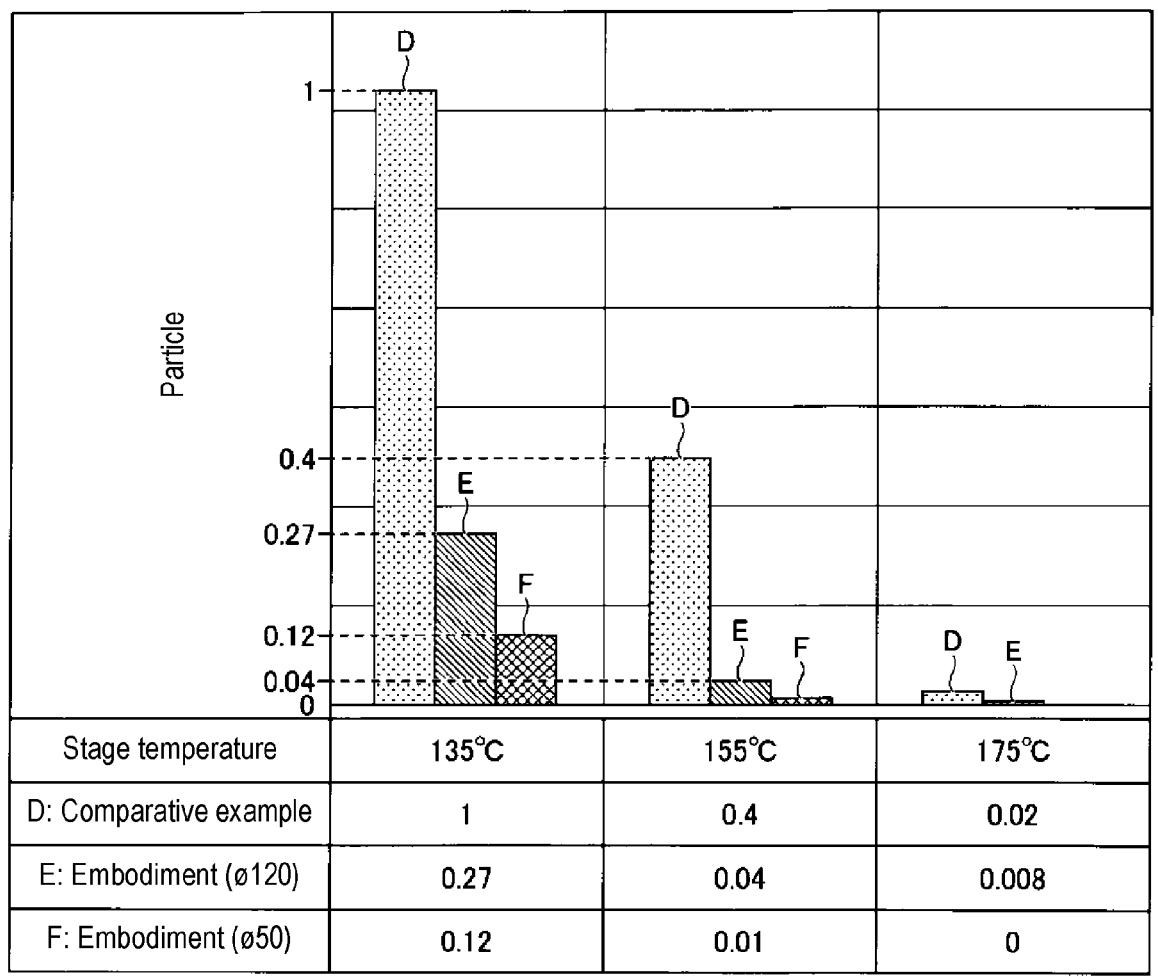
FIG. 6 is an example of a film-forming experimental result by a film-forming apparatus according to an embodiment and a film-forming apparatus of a comparative example.

FIG. 6 is a view showing an example of generation of particles as an experimental result of film-forming processing using the film-forming apparatus 1 according to the embodiment and the film-forming apparatus 9 according to the comparative example. D shows the result of generation of particles when the film-forming apparatus 9 according to the comparative example was used, and E and F show a result of generation of particles when the film-forming apparatus 1 according to the embodiment was used. E is a case where the diameter φ of the second opening 11a was set to 120 mm and F is a case where the diameter φ of the second opening 11a was set to 50 mm.

Further, the experimental result of FIG. 6 is a result obtained by performing film-forming under the same conditions as the film-forming conditions for obtaining the experimental result of FIG. 5, in which the temperature of the stage 105 was set to 135 degrees C., 155 degrees C., and 175 degrees C. using the heater 106 in the stage 105. Further, the experimental result of FIG. 6 shows a ratio of particles corresponding to a case where the particle generated when the temperature of the stage 105 was controlled to 135 degrees C. in the film-forming apparatus 9 of the comparative example D was assumed as "1."

According to the results, when the temperature of the stage 105 was set to 135 degrees C., 155 degrees C., and 175 degrees C., generation of particles when the film-forming apparatus 1 of the embodiments E and F was used was reduced to about ⅓ or less of generation of particles when the film-forming apparatus 9 of the comparative example D was used.

From the above, according to the film-forming apparatus 1 of the embodiment, it is possible to improve in-plane uniformity of the film formed on the wafer W, suppress generation of particles, and improve throughput.

Modified Example

In the film-forming apparatus 1 of this embodiment, it is possible to control the distance G (see FIG. 1) between the shower plate 12 and the stage 105. For example, the experimental results of FIGS. 5 and 6 were the results when the distance G between the shower plate 12 and the stage 105 was controlled to about 40 mm.

On the other hand, in this modified example, the distance G between the shower plate 12 and the stage 105 of the film-forming apparatus 1 was controlled to about 20 mm. The diameter φ of the second opening 11a was 120 mm and an example of a graph of a (radial) film thickness in this case is shown in FIG. 7.

Figure 7:
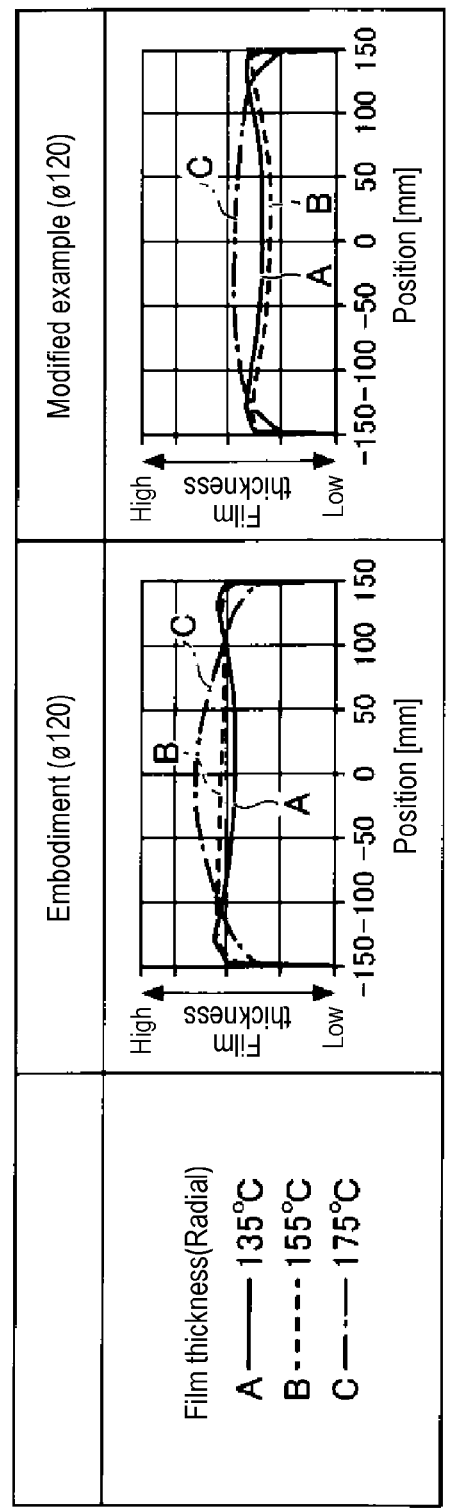
FIG. 7 is an example of a film-forming experimental result when a gap of a film-forming apparatus according to an embodiment is changed.

FIG. 7 shows a comparison between a graph of the modified example (when φ was 120 mm and the distance G was about 20 mm) and a graph of the embodiment in which the diameter φ of the second opening 11a was the same (when φ was 120 mm and the distance G is about 40 mm). As a result, when the temperature of the stage 105 was controlled to 135 degrees C. and 155 degrees C., the in-plane uniformity decreased when the distance G was controlled to 20 mm, as compared with when the distance G was controlled to 40 mm One of the reasons for this is considered that the speed of the processing gas became high at the center of the wafer W and the film-forming rate became low at the center of the wafer W, as compared with when the distance G was about 40 mm, due to the shorter distance G of about 20 mm between the shower plate 12 and the stage 105.

However, when the temperature of the stage 105 was controlled to 175 degrees C., the in-plane uniformity of the films was better when the distance G was controlled to about 20 mm than when the distance G was controlled to about 40 mm.

As a result, it can be seen that it is possible to control the in-plane uniformity of the film by controlling the distance G between the shower plate 12 and the stage 105 of the film-forming apparatus 1.

According to the embodiment and the modified example, it can be seen that influence on the in-plane uniformity of the film by the flow of a processing gas is changed by the temperature of the stage 105. Further, a conclusion was obtained that when the temperature conditions of the stage 105 were relatively low between 135 degrees C. and 155 degrees C., the in-plane uniformity of the film and the state of the particle generation were generally good in either case of the diameter φ of 120 mm or 50 mm for the second opening 11a.

Further, it can be seen that when the temperature conditions of the stage 105 were relatively low between 135 degrees C. and 155 degrees C., the film thickness variation was small and the in-plane uniformity of the film was further improved in either case of the diameter φ of 120 mm or 50 mm for the second opening 11a.

Further, it can be seen that it is possible to control the in-plane uniformity of the film with a high controllability by controlling the temperature of the stage 105, the diameter of the second opening 11a, and the distance G between the stage 105 and the shower plate 12.

A film-forming apparatus and method according to the embodiment disclosed herein should be construed as an example rather than being limited thereto in all aspects. The embodiment described above may be changed and modified in various ways without departing from the scope of the accompanying claims and the purport thereof. The matters described in the plurality of embodiments can be achieved from other configurations within a range that is not inconsistent and can be combined within a range that is not inconsistent.

Although the film-forming apparatus 1 of the present disclosure was described as a CVD, it is not limited thereto and may be a plasma processing apparatus. Further, the plasma processing apparatus may be any type of film-forming apparatus such as Capacitively Coupled Plasma (CCP), Inductively Coupled Plasma (ICP), Radial Line Slot Antenna (RLSA), Electron Cyclotron Resonance Plasma (ECR), and Helicon Wave Plasma (HWP).

A wafer W was described as an example of a substrate. However, the substrate is not limited thereto and may be various substrates that are used in Flat Panel Displays (FPD) and printed substrates.

According to an aspect, it is possible to improve in-plane uniformity of a film and suppress particles.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film-forming apparatus comprising:
a processing container having a vacuum atmosphere therein;
a stage having a heater and disposed in the processing container to load a substrate thereon;
a gas discharge mechanism provided at a position to face the stage; and
an exhaust part configured to exhaust an inside of the processing container,
wherein the gas discharge mechanism includes:
a gas intake port configured to introduce a processing gas into the processing container;
a first plate-shaped member having a first opening formed in a more radially outward position than the gas intake port; and
a shower plate disposed between the first plate-shaped member and the stage to supply the processing gas from the first opening to a process space through a plurality of gas holes,
wherein a cover ring is engaged with an outer periphery of the stage and the processing gas is exhausted radially outward by an exhaust hole formed between a bottom surface of the shower plate and a top surface of the cover ring.

2. The film-forming apparatus of claim 1, further comprising a second plate-shaped member disposed between the first plate-shaped member and the shower plate, and having a second opening at a center portion thereof.

3. The film-forming apparatus of claim 2, wherein the first opening and the second opening do not overlap in a plan view.

4. The film-forming apparatus of claim 3, wherein a diameter of the second opening is 5 to 31 cm.

5. The film-forming apparatus of claim 4, wherein an outermost gas hole of the plurality of gas holes of the shower plate is disposed in a more radially outward position than the substrate on the stage.

6. The film-forming apparatus of claim 5, wherein the first plate-shaped member has a plurality of first openings formed in a circumferential direction.

7. The film-forming apparatus of claim 6, wherein the first plate-shaped member has a circular plate member at a center portion and a plurality of supporting portions supporting the circular plate member, and faces the gas intake port.

8. The film-forming apparatus of claim 7, wherein a diameter of the circular plate member is larger than that of the gas intake port.

9. The film-forming apparatus of claim 7, wherein the circular plate member has a diameter of 8 to 34 cm.

10. The film-forming apparatus of claim 2, wherein a diameter of the second opening is 5 to 31 cm.

11. The film-forming apparatus of claim 1, wherein an outermost gas hole of the plurality of gas holes of the shower plate is disposed in a more radially outward position than the substrate on the stage.

12. The film-forming apparatus of claim 1, wherein the first plate-shaped member has a plurality of first openings formed in a circumferential direction.

13. The film-forming apparatus of claim 1, wherein the first plate-shaped member has a circular plate member at a center portion and a plurality of supporting portions supporting the circular plate member, and faces the gas intake port.

14. The film-forming apparatus of claim 1, wherein the shower plate partitions a space in the processing container into a space close to the gas intake port and the process space.

15. The film-forming apparatus of claim 1, wherein the exhaust part is positioned under the stage.

16. The film-forming apparatus of claim 1, wherein the stage has a moving mechanism that can move up/down, so that a distance between the stage and the shower plate can be controlled.

17. The film-forming apparatus of claim 1, further comprising a controller that controls the moving mechanism of the stage, the heater of the stage, supply of the processing gas, and the exhaust part.

* * * * *